United States Patent [19]
Ahmann et al.

[11] Patent Number: 4,457,466
[45] Date of Patent: Jul. 3, 1984

[54] MASK FOR PROTECTING TAB CONTACTS OF CIRCUIT BOARDS

[75] Inventors: Joseph Ahmann, Willowbrook; James J. Grammas, Westchester, both of Ill.

[73] Assignee: GTE Automatic Electric Inc., Northlake, Ill.

[21] Appl. No.: 383,906

[22] Filed: Jun. 1, 1982

[51] Int. Cl.³ .................... B23K 3/00; H05K 3/34
[52] U.S. Cl. .................................................. 228/57
[58] Field of Search ........................ 228/57; 428/595

[56] References Cited
U.S. PATENT DOCUMENTS

| | | | |
|---|---|---|---|
| 1,950,979 | 3/1934 | Franke | 428/595 |
| 4,068,792 | 1/1978 | Dixon | 228/57 |
| 4,340,164 | 7/1982 | Rizzo et al. | 228/57 |

Primary Examiner—Kenneth J. Ramsey
Attorney, Agent, or Firm—Charles A. Doktycz; Robert J. Black

[57] ABSTRACT

A printed wiring card tab protector for shielding the gold plated printed wiring card tabs from contamination with solder during a wave soldering process. The protector has a first fold that slips over the tabs and is thereby frictionally held in place while a second fold deflects away the solder wave.

3 Claims, 5 Drawing Figures

MASK FOR PROTECTING TAB CONTACTS OF CIRCUIT BOARDS

BACKGROUND OF THE INVENTION (1) Field of the Invention

The present invention relates to solder shields as used in the volume production of printed circuit cards, and more particularly to a shield for protecting the gold tabs of these cards.

(2) Description of the Prior Art

At present Titanium strips are pressed over the gold plated tabs to prevent the tabs from being contacted by the hot solder during the wave soldering process. The strips are made of Titanium as that material resists the adherence of solder. However, microscopic dots of solder do adhere to the tab protectors.

During handling of the tab protectors after removal from the cards, microscopic pieces of solder become dislodged and work their way into the tab protector slot. When the tab protector is placed on subsequent cards and the card passes over the molten solder wave, the tab protector heats up and the microscopic bits of solder on the inside of the protector melt and transfer to the gold plated tabs on the cards. Because of the excellent solderability of the gold surface the molten solder spreads on the gold surface resulting in solder dots up to 0.005 inches in diameter on the tabs. This cannot be allowed as the connector that the card plugs into has only a small gold dot that mates with the gold tabs and if the solder spot on the tabs mates with the gold on the connector an unacceptably high contact resistance results.

Efforts that were tried to solve this problem of solder adhering to the tab protectors were:
 a. To buff the protector surface.
 b. To coat it with polymerized silicon mold release.
 c. To coat it with teflon polyimide.
 d. To cover the protector with heat resistant tape.
 e. To coat it with flux.

None of these methods prevented the microscopic dots of solder from adhering to the tab protector, resulting in having to clean the bits of solder from the protector before re-use. This too was not satisfactory since:
 a. Mechanical wire brushing simply moved the bits around inside the protector, which because of their small size, had little weight and did not fall out or could not be washed out.
 b. Ultrasonic cleaning methods were unsuccessful.
 c. Chemical solder strippers were too agressive and attacked the Titanium.

Numerous handling methods were investigated to prevent the microscopic bits of solder from entering the protector but none were successful.

Since none of the above methods were fully successful, the use of the tab protectors alone was abandoned and the gold tabs were masked with a special heat resistant tape. This method prevented solder from contaminating the tabs but incurred additional labor costs to apply and remove the tape and the tape cost itself was excessive. The tab protector was still used over the tape for its stiffening qualities.

SUMMARY OF THE INVENTION

Accordingly, in order to provide an improved and consistently effective protection for the gold tabs of the printed circuit cards at a reduced cost, a new and novel tab protector was invented.

This novel tab protector consists essentially of a flattened "S" shaped strip, where the top curved portion slips over the tabs and the lower curved portion shields the tab portion by deflecting the hot solder.

DESCRIPTION OF THE PREFERRED EMBODIMENT

Figure 1:
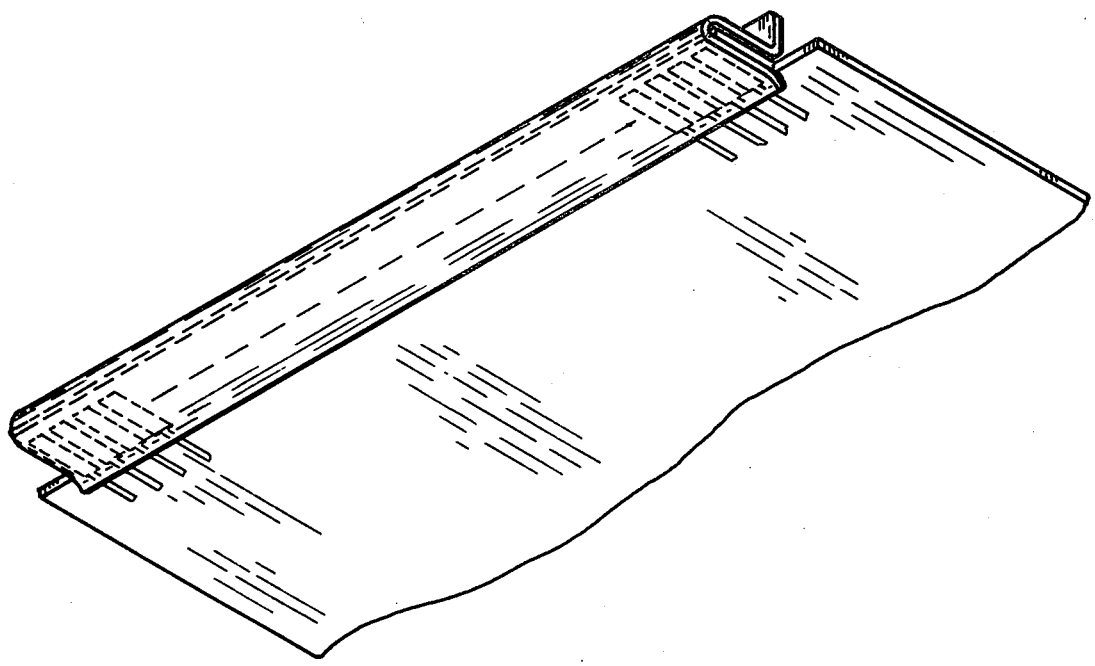
FIG. 1 shows a prior art tab protector formed of a strip of metal longitudinally folded back on itself in such a manner as to enable it to be slipped over the contact tabs of a circuit board to cover the tabs and to be frictionally retained in this positon.
Figure 2:
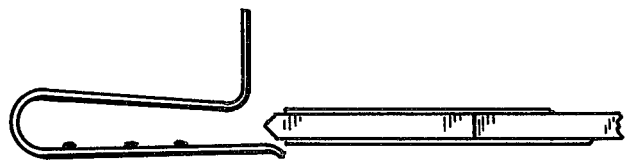
FIG. 2 is an end view of the prior art tab protector and the tab end of a circuit board showing how small specs of solder may be carried by this tab protector.
Figure 3:
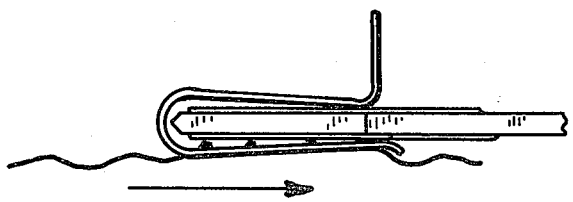
FIG. 3 is also an end view of the prior art tab protector in position on the tab end of a circuit board and the crest of a solder wave in contact with the tab protector to potentially melt the solder specs.
Figure 4:
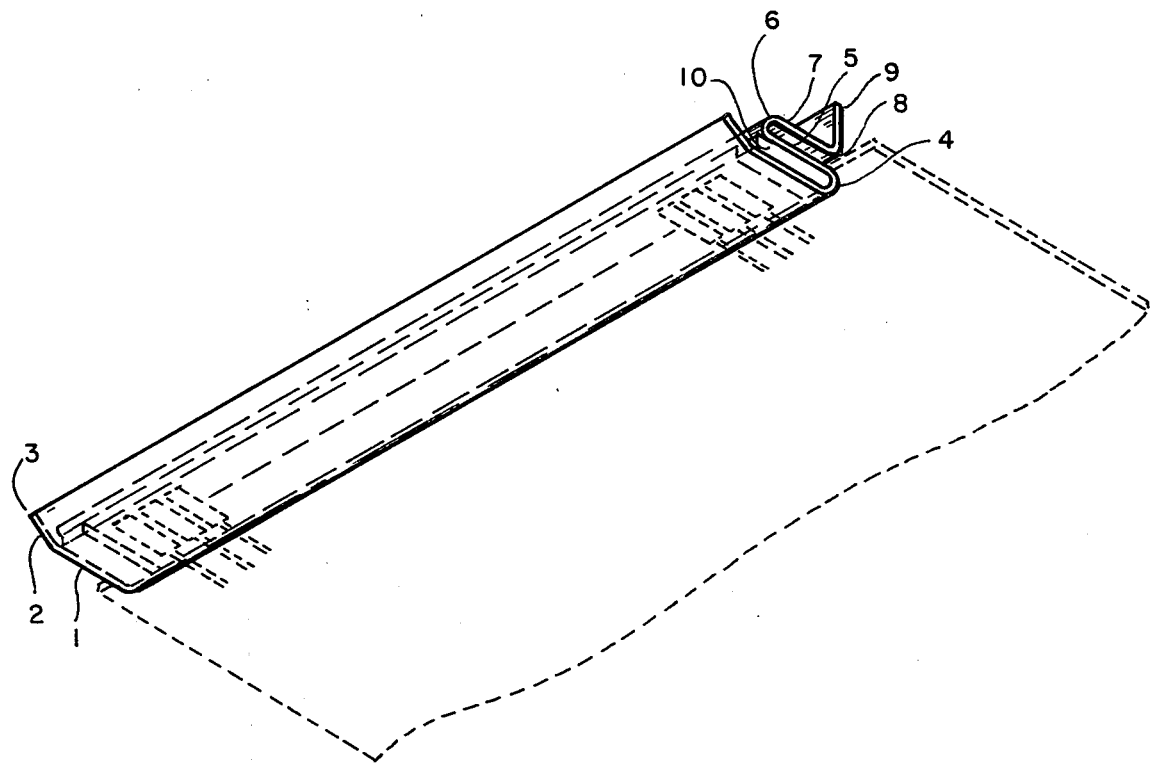
FIG. 4 is an isometric view of the improved tab protector of the present invention.

In FIG. 4 is shown a tab protector according to the invention and consists of an "S" shaped strip of metal having a first flat portion 1 bent upward along a line 2 to form a deflecting shield terminating at the leading edge 3. This leading edge 3 extends to the top sides of the card to prevent entry of molten solder. The rear end 4 of this first flat portion 1 is also bent upward to form a "U" to bring a second flat portion 5 over and approximately parallel to the first flat portion 1. The space between the flat sections 1 and 5 creates an air pocket that acts to insulate flat section 5 from direct contact with a passing solder wave 11 during the wave soldering operation. This insulating action prevents the portion 5 of the tab protector from getting hot enough during the wave soldering to melt any microscopic solder bits that may have gotten there and thus prevents tab contamination. The ends of this opening between flat sections 1 and 5 are sealed by a filets 10 to prevent molten solder from the solder wave from entering as the card passes over the wave. The forward end of this second flat portion 5 is again bent upward and back forming a second bend 6 and a third flat section 7. The spacing between the flattened sections 5 and 7 is such that the tab end of a printed circuit card may be inserted therebetween and be frictionally retained thereby.

Figure 5:
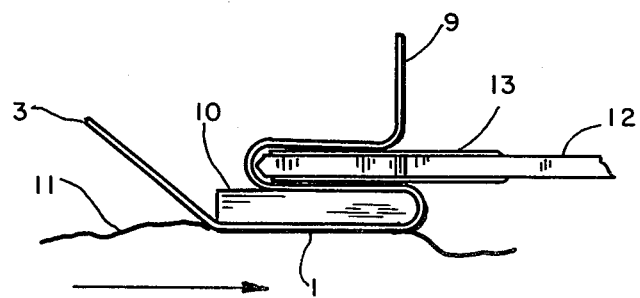
FIG. 5 is an end view of the tab protector mounted on the tab end of a circuit board.

To facilitate insertion of a printed circuit card into the opening between sections 5 and 7 an additional bend is made, this bend is at the leading edge of the section 7 to provide an upward facing tab 9. This upward facing tab 9 facilitates handling of the tab during assembly onto the card, and also lends increased stiffness to the card enhancing the soldering operation as the card will thus be flatter as it passes over the solder wave 11, FIG. 5. The curved surface at 8 provides a guiding path to facilitate the card entry into the slot formed by surfaces 5 and 7.

What is claimed is:

1. A tab protector for use in wave soldering of printed wiring cards comprising:

a horizontally elongated "S" shaped strip having a first hooked portion of said "S" shape dimensioned to slip over the tabs to be protected; and a second oppositely facing hooked portion of said "S" shaped strip to deflect solder away from said tabs and including a filet of metal at each end of said "S" shaped strip to close said second hooked portion of said "S" shape to prevent entry of solder thereinto.

2. A tab protector as claimed in claim 1 wherein said strip is made of metal.

3. A tab protector as claimed in claim 1 wherein said strip is made of the metal Titanium.

* * * * *